US008547278B2

(12) United States Patent
Jun et al.

(10) Patent No.: US 8,547,278 B2
(45) Date of Patent: Oct. 1, 2013

(54) SENSING DEVICE HAVING MULTI BEAM ANTENNA ARRAY

(75) Inventors: Dong Suk Jun, Daejeon (KR); Yong Sung Eom, Daejeon (KR); Hyun Seo Kang, Gwangju-Si (KR); Moo Jung Chu, Daejeon (KR); Soo Young Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 382 days.

(21) Appl. No.: 12/771,538

(22) Filed: Apr. 30, 2010

(65) Prior Publication Data

US 2011/0050499 A1 Mar. 3, 2011

(30) Foreign Application Priority Data

Aug. 31, 2009 (KR) ........................ 10-2009-0081145
Dec. 11, 2009 (KR) ........................ 10-2009-0123337

(51) Int. Cl.
*H01Q 3/22* (2006.01)
*H01Q 3/00* (2006.01)
*H01L 21/30* (2006.01)

(52) U.S. Cl.
USPC ............................ 342/375; 342/368; 438/456

(58) Field of Classification Search
USPC .................. 342/368, 372, 375; 438/51, 456; 257/275
See application file for complete search history.

(56) References Cited

U.S. PATENT DOCUMENTS 5,913,134 A * 6/1999 Drayton et al. ............... 438/456
6,188,361 B1 2/2001 George et al.
7,307,586 B2 12/2007 Peshlov et al.
7,358,913 B2 4/2008 Ebling et al.

FOREIGN PATENT DOCUMENTS

KR 10-0207600 B1 4/1999
KR 10-0248400 12/1999
KR 10-0287059 1/2001
KR 10-0736762 A 7/2007
KR 10-0818173 A 3/2008

OTHER PUBLICATIONS

Dirk Nüβler et al., "A two dimensional lens stack design for 94 GHz", German Microwave Conference, GeMIC 2009 art., No. 4815899, p. 1-4(2009).

Peng Chen et al.,"A Multibeam Antenna Based on Substrate Integrated Waveguide Technology for MIMO Wireless Communications", IEEE Transactions on Antennas and Propagation, vol. 57, No. 6, p. 1813-1821(2009).

* cited by examiner

*Primary Examiner* — Dao Phan
(74) *Attorney, Agent, or Firm* — Rabin & Berdo, P.C.

(57) ABSTRACT

A sensing device may include an antenna. The antenna may include a top wafer and a bottom wafer coupled to the top wafer. The antenna may further include an air cavity between the top wafer and the bottom wafer. The sensing device may further include a substrate and an interposer disposed between the antenna and the substrate.

10 Claims, 24 Drawing Sheets

(a)

(b)

SENSING DEVICE HAVING MULTI BEAM ANTENNA ARRAY

CROSS-REFERENCE TO RELATED APPLICATIONS

This U.S. non-provisional patent application claims priority under 35 U.S.C. §119 of Korean Patent Application Nos. 10-2009-0081145, filed on Aug. 31, 2009, and 10-2009-0123337, filed on Dec. 11, 2009, the entire contents of which are hereby incorporated by reference.

BACKGROUND OF THE INVENTION

The present invention disclosed herein relates to a sensing device, and more particularly, to a sensing device having a multi beam antenna array.

Sensing devices are devices that detect configurations of objects using a lens or antenna to display the detected objects as images. The sensing devices may be used for searching concealed objects and a position of a fire point in smoke. Also, the sensing devices may be used when a flying object avoids obstacles under fog or cloudy climate condition. Such a sensing device includes an optical camera or an RF camera.

FIG. 1 is a schematic view illustrating an example of an optical camera. Referring to FIG. 1, in an optical camera 10, a light beam 11 passes through an optical lens 12, and then is detected by a light sensor 13.

FIG. 2 is a schematic view illustrating an example of an RF camera. Referring to FIG. 2, in an RF camera 20, an electromagnetic beam 21 passes through an antenna array 22 and a microwave lens 23, and then is detected by a detector array 24. The RF camera 20 may detect an image of an object through which light does not optically pass.

According to a conventional antenna array and sensing device including the antenna array, an antenna design and manufacturing process are complete, and the manufacturing costs are expensive.

SUMMARY OF THE INVENTION

The present invention provides a sensing device in which an antenna design and manufacturing process can be simplified and a manufacturing cost can be reduced.

Embodiments of the present invention provide sensing devices having a multi beam antenna array, the sensing devices including: an antenna array including a plurality of antennas; a plurality of low noise amplifiers respectively connected to the antennas to amplify radio frequency signals received from the respective antennas; a delay line box including a plurality of delay lines, each delay line delaying the signals amplified by the low noise amplifiers for a predetermined time; and a detector detecting the output signals of the delay ling box.

In some embodiments, the antenna array may be manufactured using a microelectromechanical systems (MEMS) process. The antenna array may include a timed array. The antenna array may be used in a hamming antenna array manner.

In other embodiments, the delay line box may include load resistances connected between both ends of the plurality of delay lines and a ground terminal. The detector may be realized as a diode. The diode may include a millimeter wave zero bias GaAs schottky diode or a tunnel diode.

In other embodiments of the present invention, sensing devices having a multi beam antenna array include a top wafer; and an antenna manufactured using the top wafer and a bottom wafer bond-coupled to the top wafer, wherein the antenna has an air cavity between the top wafer and the bottom wafer.

In some embodiments, a slot pattern may be disposed on a bond coupling part of the bottom wafer. A patch may be disposed on the top wafer, and a feed line is disposed on the bottom wafer.

In other embodiments, sensing devices may further include a substrate; and an interposer disposed between the antenna and the substrate. The substrate may be formed of silicon, GaAs, low temperature co-fired ceramic, or ceramic.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Generally, when one antenna is used, a single beam pattern is formed. However, it may be difficult to obtain a desired beam width and antenna gain using the one antenna. Thus, a multi beam antenna array in which a plurality of antennas are arranged according a specific roll is being used.

The multi beam antenna array may be classified into a timed array and a phased array. The timed array has a wide instant bandwidth and a constant group delay. On the other hand, the phased array has a narrow instant bandwidth and a constant phased shift. The timed array includes a scanning antenna array and a multi beam staring array.

Figure 1:
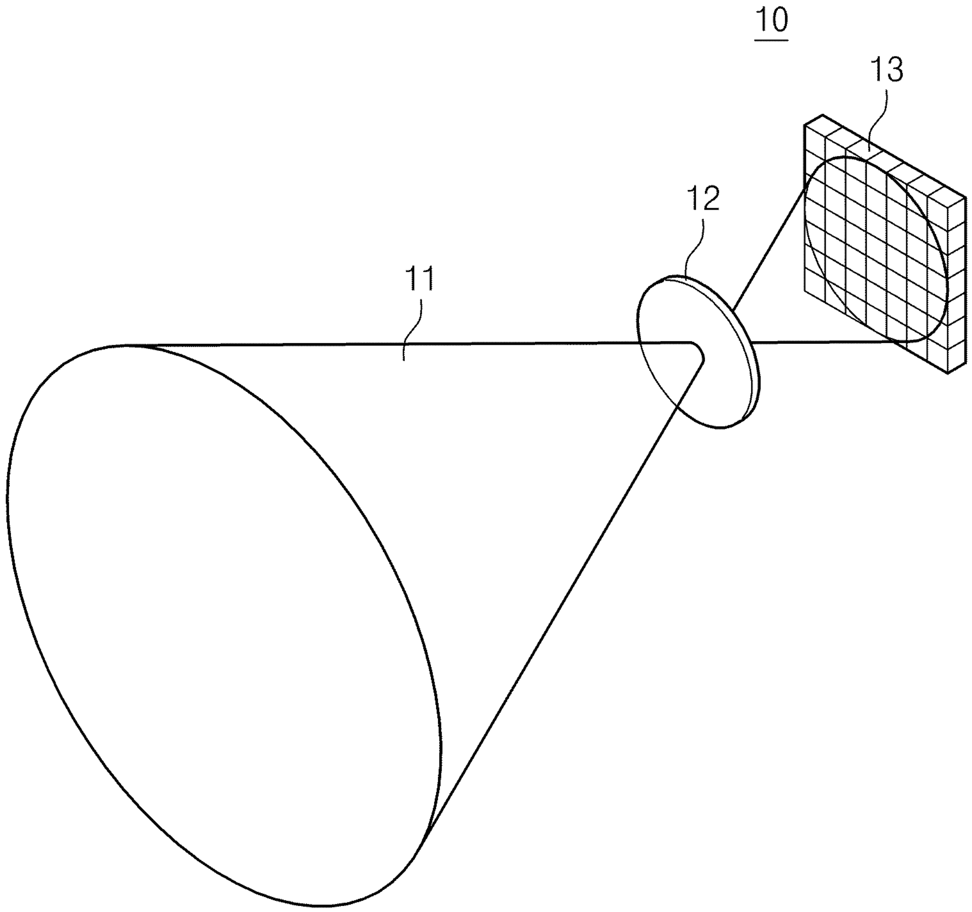
FIG. 1 is a schematic view illustrating an example of an optical camera.
Figure 2:
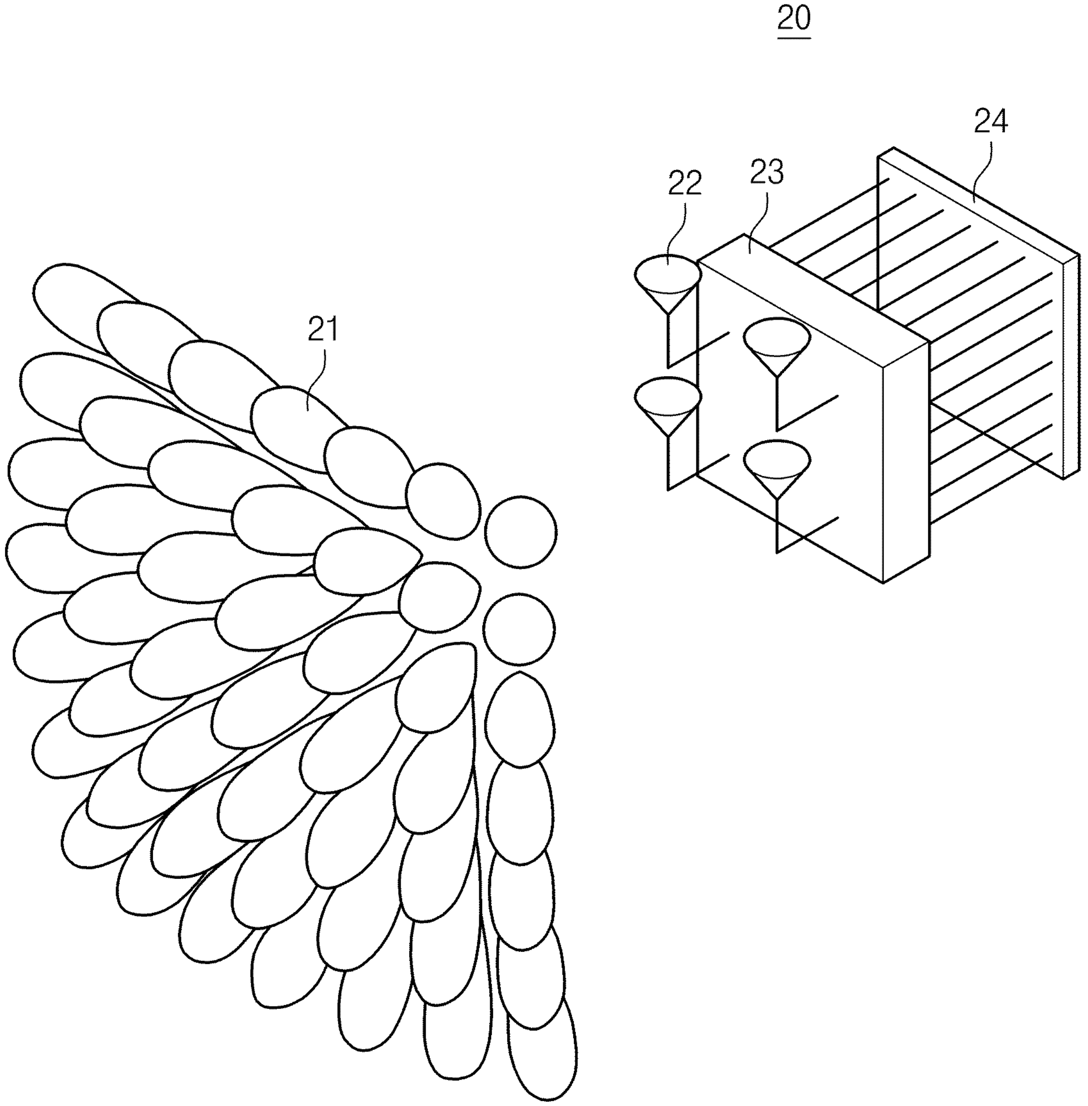
FIG. 2 is a schematic view illustrating an example of an RF camera.
Figure 3:
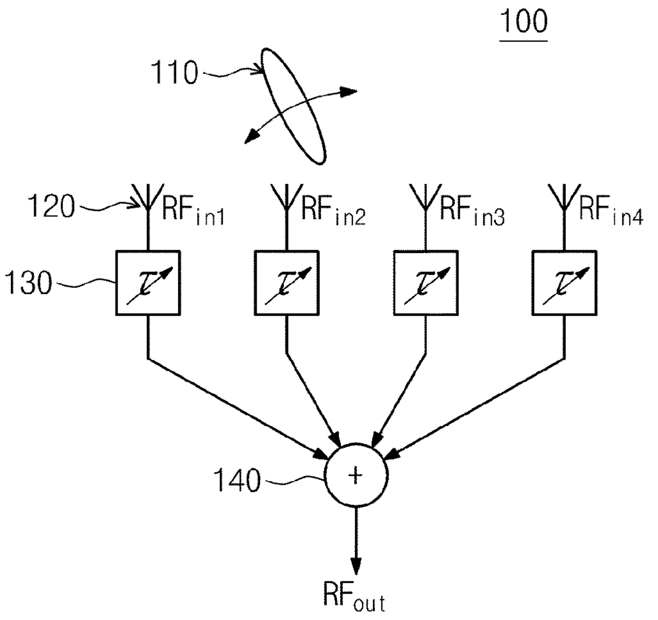
FIG. 3 is a schematic view illustrating an example of a sensing device using a scanning antenna array.

FIG. 3 is a schematic view illustrating an example of a sensing device using a scanning antenna array. Referring to FIG. 3, a sensing device 100 includes an antenna array 120, a plurality of time varying units 130, and a combiner 140. The sensing device 100 illustrated in FIG. 3 scans radio frequency signals RFin1 to RFin4 of one beam 110 in a time varying manner using the antenna array 120 and the plurality of time varying units 130. The combiner 140 combines the signals received in the time varying manner to output one electrical signal RFout.

Figure 4:
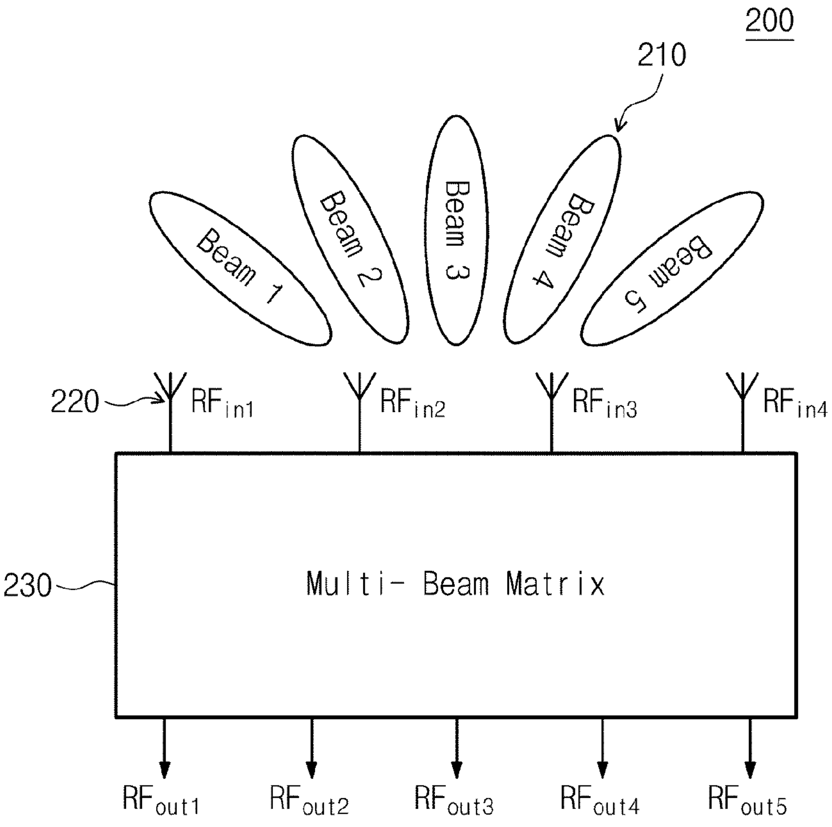
FIG. 4 is a schematic view illustrating an example of a sensing device using a multi beam staring array.

FIG. 4 is a schematic view illustrating an example of a sensing device using a multi beam staring array. Referring to FIG. 4, a sensing device 200 includes an antenna array 220 and a multi beam matrix 230. The sensing device 200 illustrated in FIG. 4 receives radio frequency signals RFin1 to RFin4 of a multi beam 210 through four antennas 220.

The multi beam matrix 230 outputs a plurality of electrical signals RFout1 to RFout5 using the receiving signals. Here, the outputted electrical signals have the same number as the multi beam 210. The sensing device 200 using the multi beam staring array may reduce an image capture time.

The multi beam matrix 230 includes a microwave lens, a circuit using a timed delay, and a circuit using a delay line. The multi beam matrix 230 may be classified into a multi beam matrix 1D structure connected to two antennas and a multi beam matrix 2D structure connected to four antennas. Hereinafter, various sensing devices including the multi beam antenna array and the multi beam matrix will be described.

Figure 5:
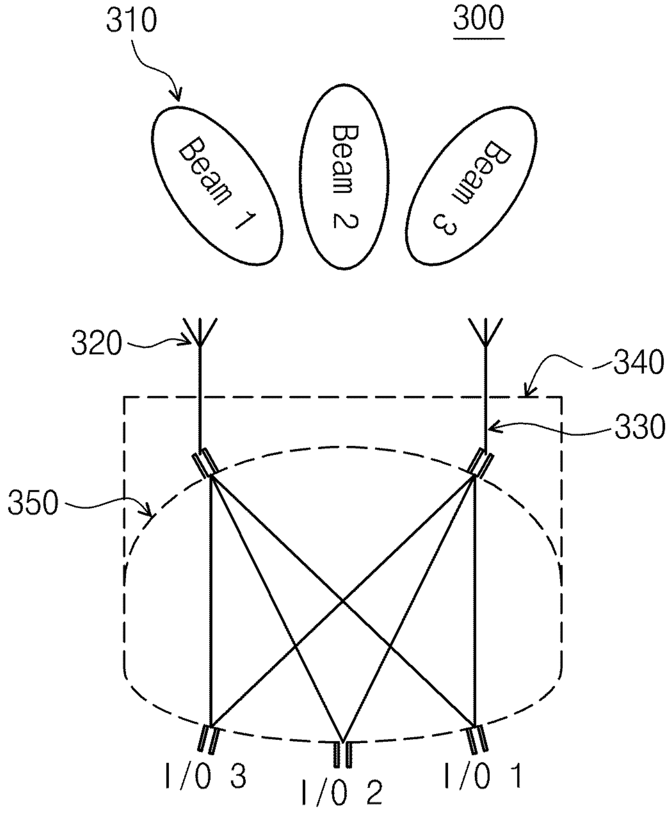
FIGS. 5 and 6 are views of a sensing device using a microwave lens as a multi beam matrix.
Figure 6:
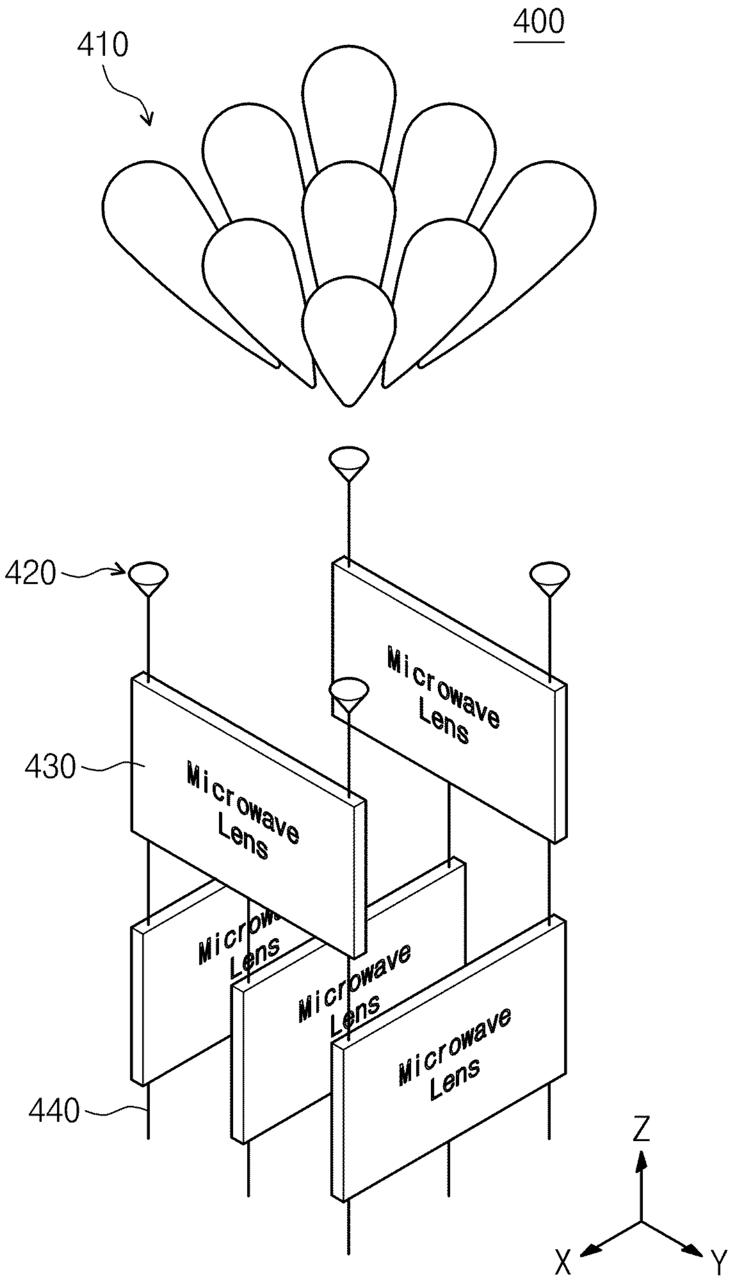

FIGS. 5 and 6 are views of a sensing device using a microwave lens as a multi beam matrix. FIG. 5 illustrates a multi beam matrix 1D structure of a microwave lens. FIG. 6 illustrates a multi beam matrix 2D structure of a microwave lens.

Referring to FIG. 5, a sensing device 300 includes two antennas 320, an RF cable 330, an outer lens 340, and an inner lens 350. The sensing device 300 illustrated in FIG. 5 receives a radio frequency signal of a multi beam 310 through the two antennas 320 and the RF cable 330. The received signal is outputted through input/output terminals I/O1, I/O2, and I/O3 via the outer lens 340 and the inner lens 350.

Referring to FIG. 6, a sensing device 400 includes four antennas 420 and a multi beam matrix 430 including five microwave lenses. Each of the microwave lenses has the same internal constitution as that of FIG. 5. The sensing device 400 illustrated in FIG. 6 receives a radio frequency signal of a multi beam 410 having 3×3 directions through the four antennas 420. The received signal is outputted into a 3×3 detector array (not shown) through nine input/output terminals via the multi beam matrix 430.

Figure 7:
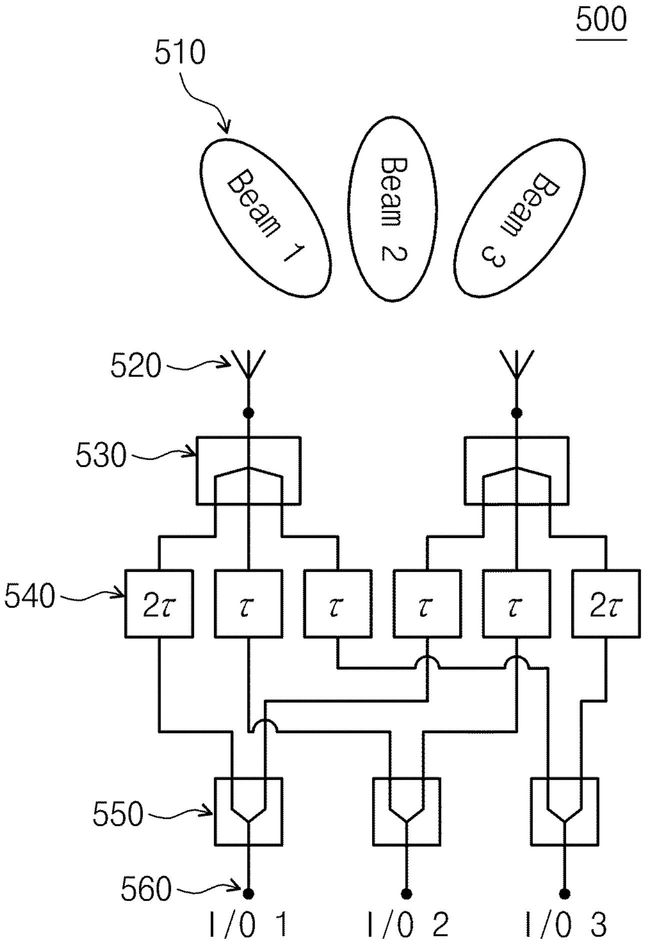
FIGS. 7 and 8 are view of a sensing device using a circuit including a timed delay as a multi beam matrix.
Figure 8:
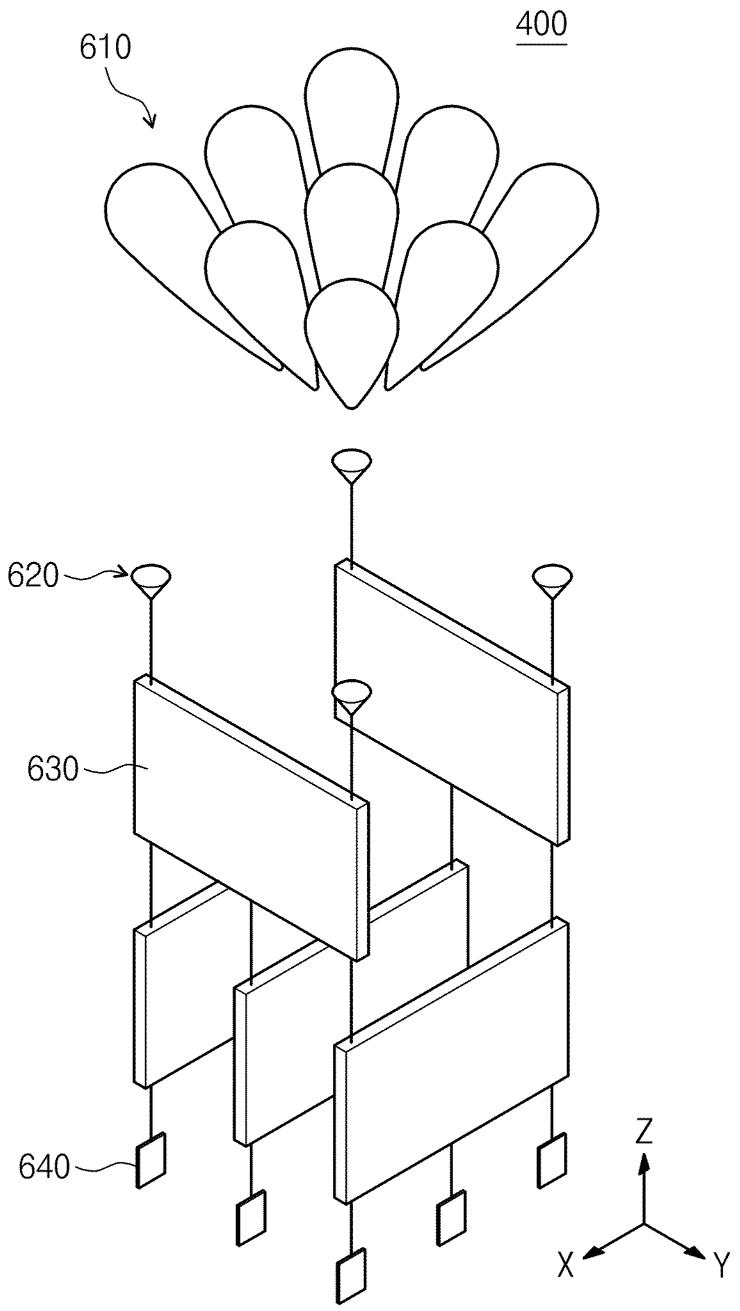

FIGS. 7 and 8 are view of a sensing device using a circuit including a timed delay as a multi beam matrix. FIG. 7 illustrates a multi beam matrix 1D structure, and FIG. 8 illustrates a multi beam matrix 2D structure.

Referring to FIG. 7, a sensing device 500 includes two antennas 520, two distributors 530, six timed delays 540, three combiners 550, and three input/output terminals 560. The sensing device 500 illustrated in FIG. 7 receives a radio frequency signal of a multi beam 510 through the two antennas 520. The distributors 530 distribute the received signal into three signals. The timed delays 540 delay the distributed signals according to a preset delay time. The combiners 550 combine the signals outputted from the corresponding timed delays 540. The input/output terminals output the combined signals.

Referring to FIG. 8, a sensing device 600 includes four antennas 620 and a multi beam matrix 630. The multi beam matrix 630 includes five matrixes of FIG. 7. Each of the matrixes has the same internal constitution as that of FIG. 7. The sensing device 600 illustrated in FIG. 8 receives a radio frequency signal of a multi beam 610 having 3×3 directions through the four antennas 620. The received signal is outputted into a 3×3 detector array (not shown) through nine input/output terminals 640 via the multi beam matrix 630.

Figure 9:
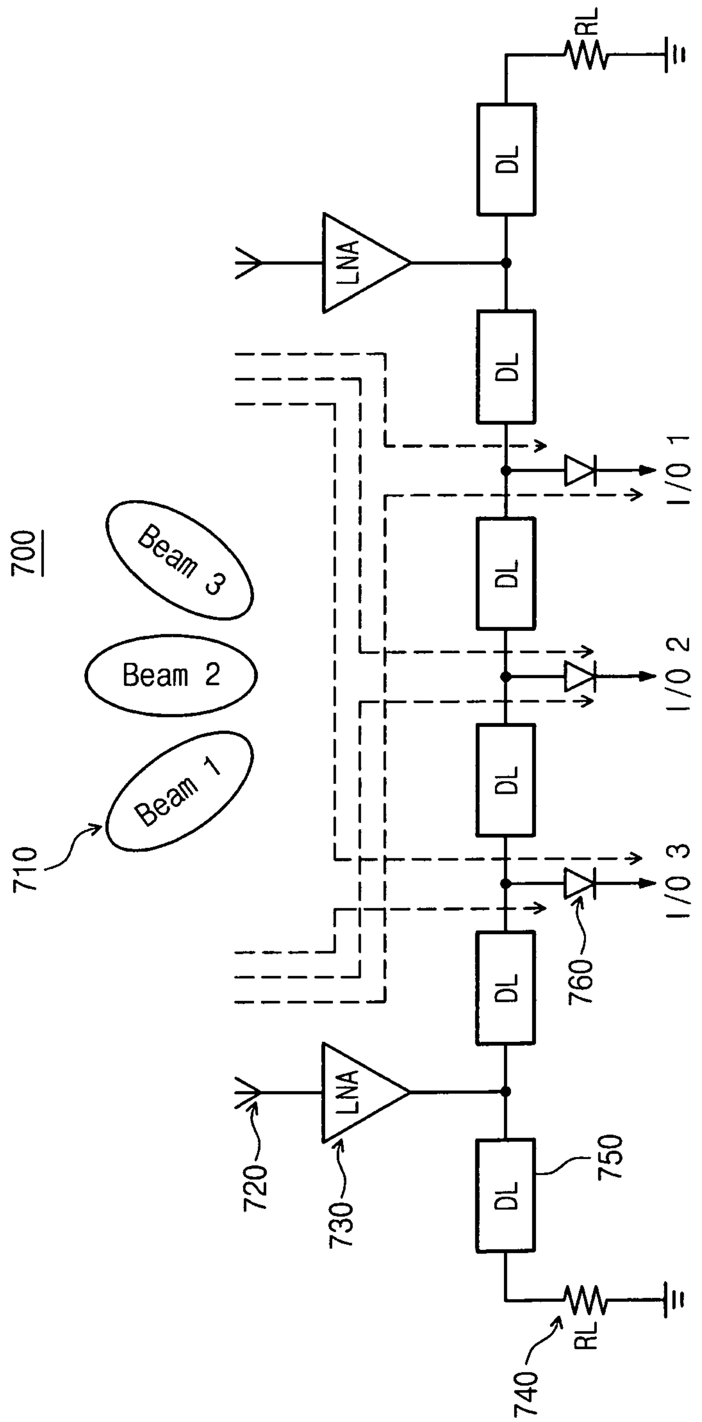
FIG. 9 is a view of a sensing device having a multi beam matrix 1D structure according to an embodiment of the present invention.
Figure 10:
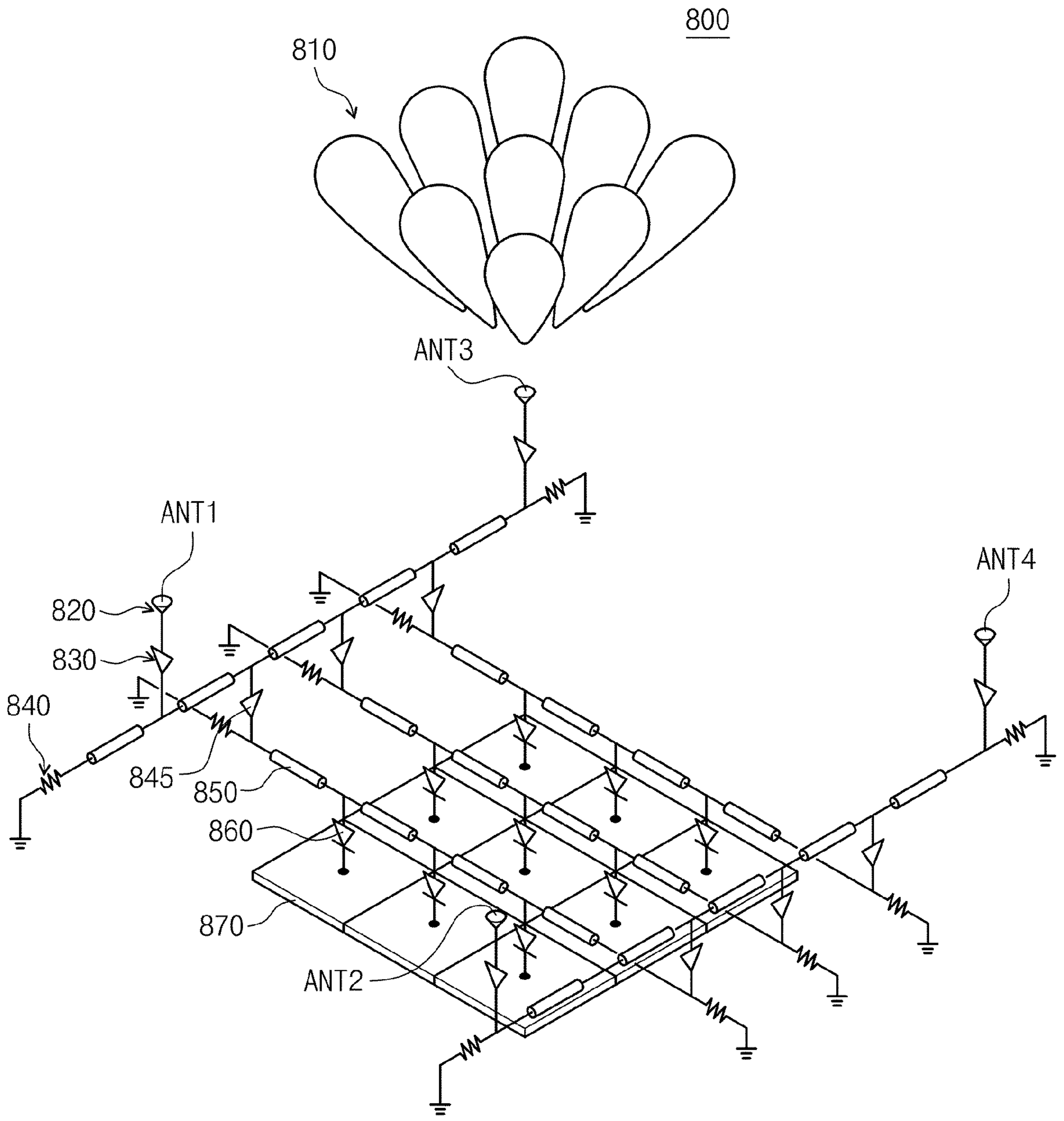
FIG. 10 is a view of a sensing device having a multi beam matrix 2D structure according to an embodiment of the present invention.

FIGS. 9 and 10 are views of a sensing device according to an embodiment. Multi beam matrixes of sensing devices 700 and 800 illustrated in FIGS. 9 and 10 use a delay line or a diode that are relatively light and simple devices.

FIG. 9 is a view of a sensing device 700 having a multi beam matrix 1D structure according to an embodiment of the present invention. Referring to FIG. 9, the sensing device 700 according to an embodiment includes two antennas 720, two low noise amplifiers (LNAs) 730, two load resistances (RLs), a plurality of delay lines (DLs) 750, and three detectors 760. Here, the sensing device 700 according to an embodiment of the present invention may include a greater number of delay lines 750 or detectors 760 than those of FIG. 9.

The sensing device 700 illustrated in FIG. 9 receives a radio frequency signal of a multi beam 710 through the two antennas 720. The LNAs 730 amplifies the weak signal received through the antennas 720. RLs 740 are connected to ground terminals, respectively. The plurality of DLs 750 is connected in series between the two RLs 740. Each of the DLs 750 may be a unit delay cell and realized to have an identical delay time.

The signals amplified by the LNAs 730 are transmitted to the detector 760 via one or more DLs 750. The detectors 760 may be realized using a device having superior voltage sensitivity. The detected electrical signals are outputted through input/output terminals I/O1, I/O2, and I/O3. For example, the detectors 760 may be realized as a millimeter wave zero bias GaAs schottky diode or a tunnel diode.

FIG. 10 is a view of a sensing device 800 having a multi beam matrix 2D structure according to an embodiment of the present invention. Referring to FIG. 10, the sensing device 800 includes four antennas (ANT1 to ANT4) 820, four LANs 830, a plurality of RLs 840, a plurality of transconductance amplifiers 845, a plurality of DLs 850, nine detectors 860, and a 3×3 detector array 870.

The sensing device 800 illustrated in FIG. 10 receives a radio frequency signal of a multi beam 810 having 3×3 directions through the four antennas (ANT1 to ANT4) 820. The signals amplified by the LANs 830 are transmitted to the nine detectors 860 having superior voltage sensitivity via one or more DLs and transconductance amplifiers 845. Each of the detected electrical signals is outputted into the 3×3 detector array 870 through input/output terminals.

Current sensitivity of a diode used as the detector 860 may be expressed as Equation (1).

$$\beta = \frac{q}{2nkT} = \frac{5400}{T} \quad (1)$$

where T represents a Kelvin temperature, and n, q, and k represent a constant.

A junction resistance of the diode may be expressed as Equation (2).

$$R_j = \frac{nkT}{qI} = \frac{T}{11I} \quad (2)$$

where T represents a Kelvin temperature, I represents a bias current, and n, q, and k represent a constant.

When a diode resistance is greater than a load resistance, voltage sensitivity is the current sensitivity multiplied by the junction resistance. The voltage sensitivity is independent of a temperature. The voltage sensitivity may be expressed as Equation (3).

$$\gamma_0 = \beta R_j = \frac{490}{I} \quad (3)$$

In a specific case, the voltage sensitivity may be reduced by a junction capacitance and a series resistance of the diode. The voltage sensitivity of the diode in the specific case may be expressed as Equation (4).

$$\gamma = \gamma_0/(1+4\pi^2 f^2 C_j^2 R_s R_j) \quad (4)$$

Referring to Equation (4), the voltage sensitivity of the diode has temperature dependence due to the junction resistance $R_j$. For example, when it is assumed that I=0.02 mA, $R_B$=25Ω, $C_j$=1 pF, and f=10 GHz, the voltage sensitivity of the diode may be expressed as Equation (5).

$$\gamma = \gamma_0/(1+0.0045T) \quad (5)$$

According to Equation (5), it is seen that the voltage sensitivity of the diode has an independent characteristic that is not almost affected by a temperature. Thus, the sensing devices 700 and 800 illustrated in FIGS. 9 and 10 are only a little affected by external environment such as a temperature.

Also, according to the sensing devices 700 and 800 illustrated in FIGS. 9 and 10, since a little device is required and a light device (e.g., the delay line or the diode) is used, the sensing devices 700 and 800 having properties such as light weight and low cost may be realized. In addition, since the sensing devices 700 and 800 according to an embodiment of the present invention have relatively simple circuit configurations, it is easy to design and integrate them.

Figure 11:
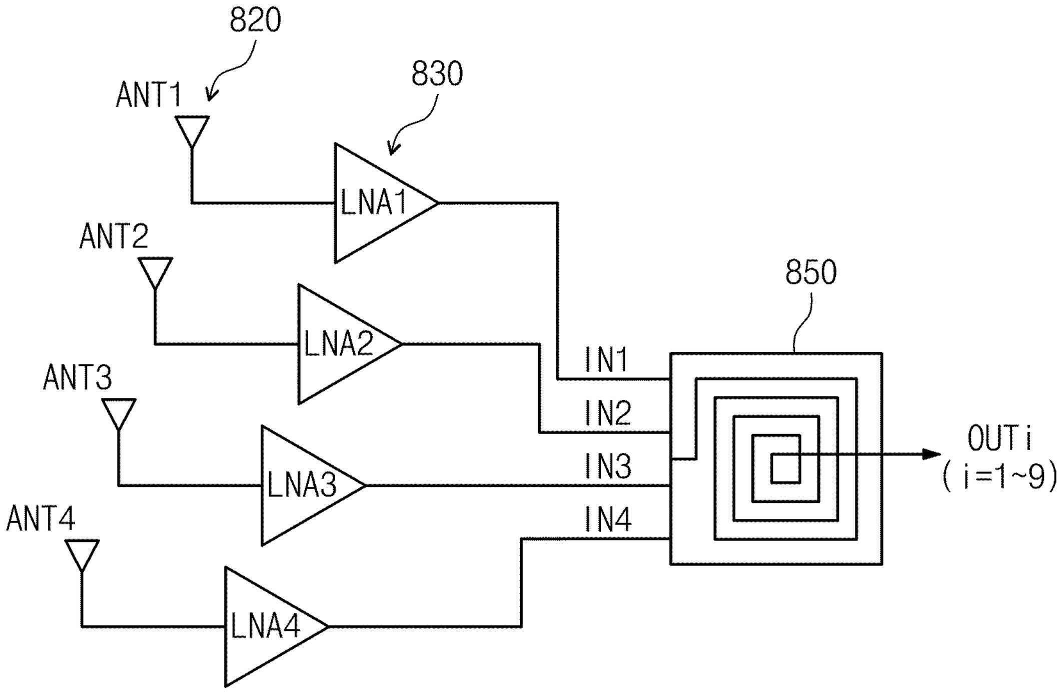
FIG. 11 is a circuit diagram illustrating an antenna, a low noise amplifier, and a delay line box of FIG. 10.

FIG. 11 is a circuit diagram illustrating the antennas (ANT1 to ANT4) 820, the LNA 830, and a delay line box 850 of FIG. 10. Referring to FIG. 11, radio frequency signals inputted through the four antennas (ANT1 to ANT4) 820 are amplified by the four LANs (LNA1 to LNA4) 830. The amplified signals are inputted into the delay line box 850. The delay line box 850 includes four input terminals IN1 to IN4 and nine output terminals OUT1 to OUT9. The delay line box 850 outputs signals that are delayed for a predetermined time.

Figure 12:
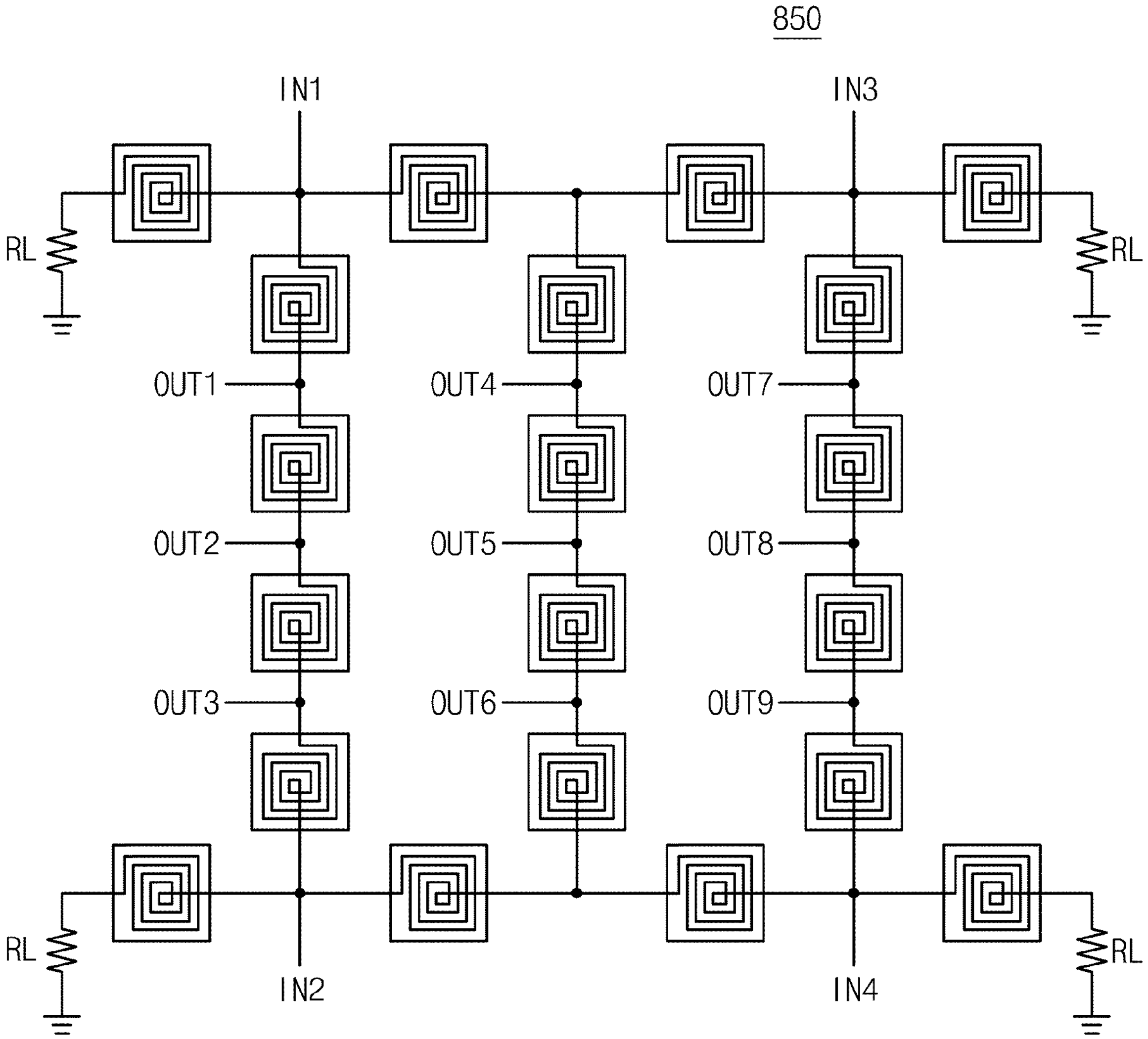
FIG. 12 is a plan circuit diagram illustrating the delay line box of FIG. 11.

FIG. 12 is a plan circuit diagram illustrating the delay line box 850 of FIG. 11. Referring to FIG. 12, the delay line box 850 includes the four input terminals IN1 to IN4, the four load resistances RLs, the plurality of delay lines DLs, and the nine output terminals OUT1 to OUT9. Each of the delay lines DLs may be a unit delay cell and delay a signal for a predetermined time τ. The delay line box 850 delays signals inputted from the four input terminals IN1 to IN4 for a time that is a constant times greater than the unit delay cell, and then outputs the delayed signals into the nine output terminals OUT1 to OUT9. The delay line box 850 transmits the output signals into the detector (see reference numeral 860 of FIG. 10).

Figure 13:
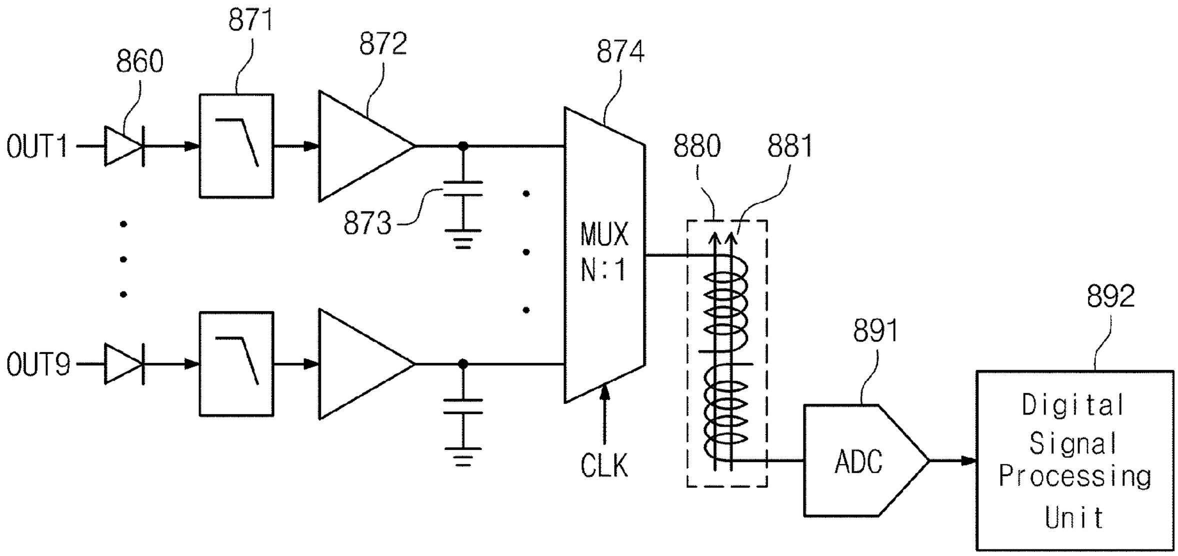
FIG. 13 is a block diagram illustrating a process of processing signals OUT1 to OUT9 outputted from the delay line box of FIG. 12.

FIG. 13 is a block diagram illustrating a process of processing signals OUT1 to OUT9 outputted from the delay line box 850 of FIG. 12. Referring to FIG. 13, the output signals OUT1 to OUT9 outputted from the delay line box 850 pass through the detector 860, a low pass filter (LPF) 871, an integrator 872, a capacitor 873, and a multiplexer (MUX) 874.

The LPF 871 outputs signals having a frequency band lower than a given cut off frequency, and signals having a frequency band greater than the given cut off frequency are cut off by the LPF 871. That is, the LPF 871 filters only signals having a low frequency band of signals passing through the detector 860. The signals passing through the LPF 871 are provided to the integrator 872. The integrator 872 integrates the signals passing through the LPF 871 with respect to a time. The signals passing through the integrator 871 are stored in the capacitor 873, and then provided to the MUX 874. The MUX 874 selects one of the nine input signals and outputs the selected signal according to a clock signal CLK.

The output signal of the MUX 874 is provided to an analog to digital converter (ADC) 891 via a wireless through silicon via (wireless TSV) 880. The wireless TSV 880 may transmit a signal from a wafer to a wafer using an inductance coupling 881 without requiring a TSV. The ADC 891 converts an electrical analog signal of the wireless TSV 880 into a digital signal. The converted digital signal is provided to a digital signal processing unit 892.

Figure 14:
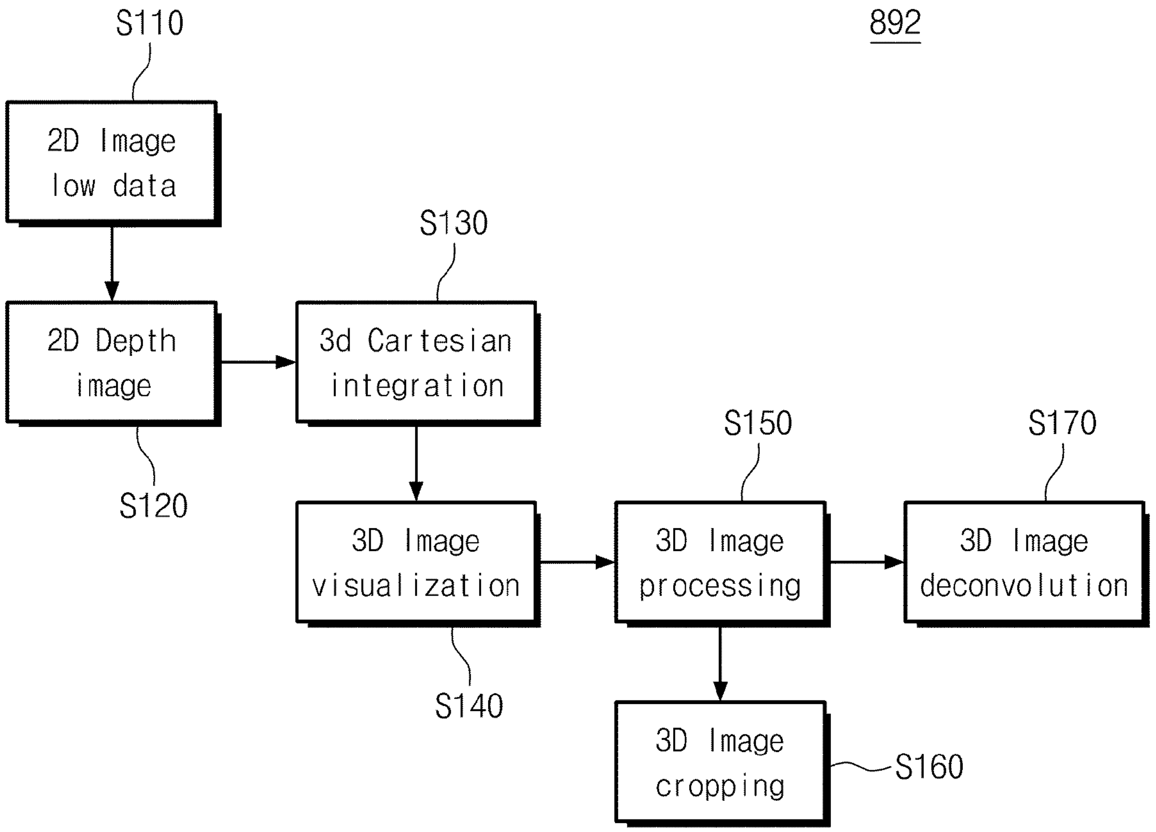
FIG. 14 is a flowchart illustrating a signal processing of a digital signal processing unit of FIG. 13.

FIG. 14 is a flowchart illustrating a signal processing of the digital signal processing unit 892 of FIG. 13. The digital signal processing unit 892 produces a 2-dimensional (2D) depth image (S120) to obtain data of a distance from 2D image low data (S110) to each pixel of the detector array (see reference numeral 870 of FIG. 10). The digital signal processing unit 892 obtains a 3-dimensional (3D) image using the 2D depth image.

The digital signal processing unit 892 sequentially performs 3D Cartesian integration (S130), 3D image visualization (S140), and 3D image processing (S150) to obtain a 3D image having high resolution. Here, the 3D Cartesian integration (S130) uses a volumetric pixel that well shows a cubical pixel having a specific volume. The digital signal processing unit 892 performs 3D image cropping (S160) or 3D image deconvolution (S170) for obtaining a clear image according to the depth information of the displayed image. The 3D image deconvolution (S170) is performed to compensate timing responses, noise, and range tail of the detector 860.

Figure 15:
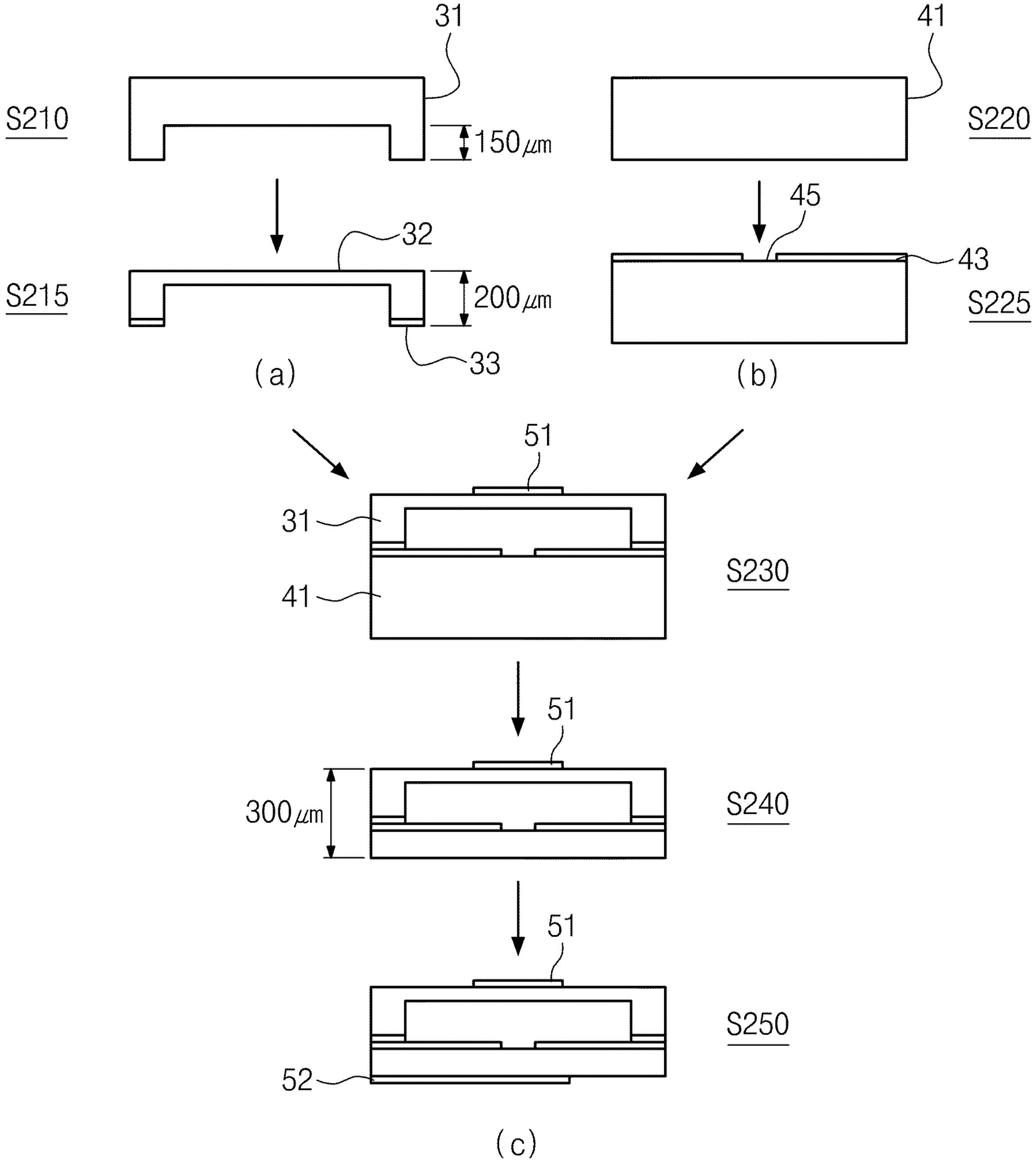
FIG. 15 is a flowchart a process of manufacturing an antenna of a sensing device according to an embodiment of the present invention.

FIG. 15 is a flowchart a process of manufacturing an antenna of a sensing device according to an embodiment of the present invention. FIG. 15A illustrates a processing of a top wafer, and FIG. 15B illustrates a processing of a bottom wafer. FIG. 15C illustrates a coupling between the top wafer and the bottom wafer and an antenna manufacturing process.

Referring to FIG. 15A, in operation S210, the top wafer 31 is cleaned, and then, a masking process is performed to perform a deep reactive-ion etching (DRIE) process. Here, the DRIE process is performed to etch the top wafer 31 by a thickness of about 150 um. In operation S215, a chemical mechanical polishing process is performed on a top surface 32 of the top wafer 31 to form the top wafer 31 with a thickness of about 200 um. Also, to couple the top wafer 31 to the bottom wafer 41, a bonding pattern 33 having a thickness of about 500 A to about 30,000 A is formed on the top wafer 31 using Au/Ti.

Referring to FIG. 15B, in operation S220, the bottom wafer 41 having a thickness of about 650 um to about 700 um is cleaned. In operation S225, to couple the bottom wafer 41 to the top wafer 31, a deposition process is performed on the bottom wafer 41 using Au/Ti to form a bonding pattern 43 having a thickness of about 500 A to about 30,000 A. Thereafter, a masking process for forming a slot pattern 45 is performed, and a dry etching process is performed.

Referring to FIG. 15C, in operation S230, the top wafer 31 and the bottom wafer 41 are bond-coupled to each other. Au/Ti having a thickness of about 500 A to about 10,000 A is deposited on a top surface 31 of the top wafer 31. Then, a masking process for forming a patch pattern 51 and a dry etching process are performed. In operation S240, a CMP process is performed on an under surface of the bottom wafer 41 to form the top wafer 31 and the bottom wafer 41, which have a total thickness of about 300 um. In operation S250, a masking process is performed on a microstrip line pattern formed on the under surface of the bottom surface 41, and then, a dry etching process is performed to form a feed line 52.

Figure 16:
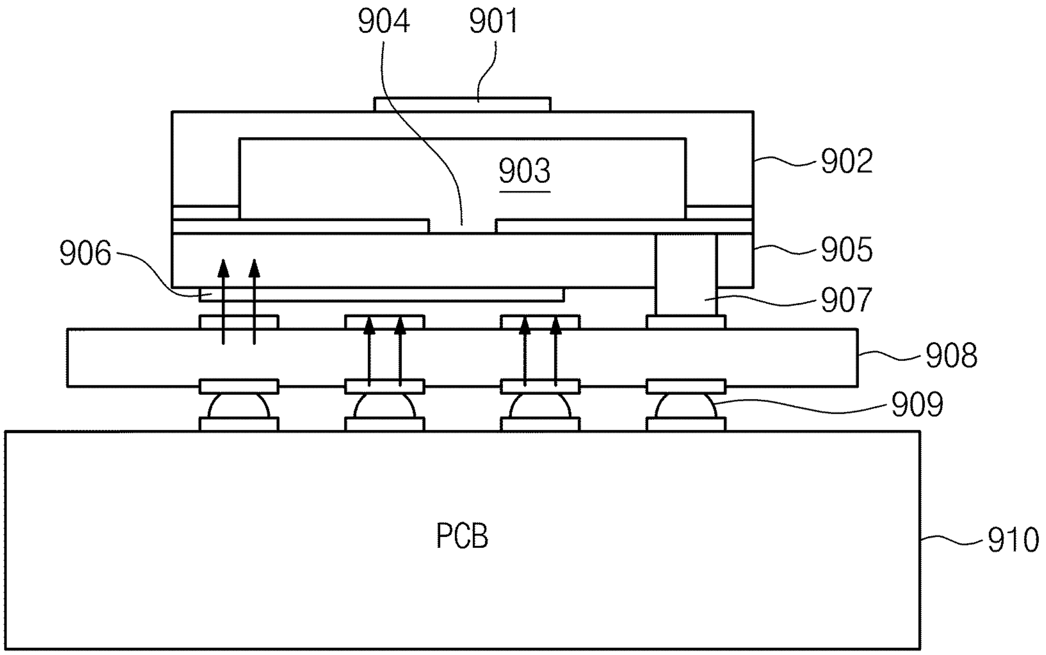
FIG. 16 is a sectional view illustrating a structure of a sensing device according to an embodiment of the present invention.

FIG. 16 is a sectional view illustrating a structure of a sensing device according to an embodiment of the present invention. In FIG. 16, the antenna (see reference numeral 820 of FIG. 10) including a patch 901, a top wafer 902, an air cavity 903, a bottom wafer 905, and a feed line 906 is manufactured through the processes described with reference to FIG. 15.

An interposer 908 is disposed between the antenna and a printed circuit board (PCB) 910. The antenna and the interposer 908 are connected to each other through a TSV 907 filled with an intermetallic compound. Also, the interposer 908 and the PCB 910 are connected to each other through a solder ball 909. Here, the PCB 910 may be formed of silicon, GaAs, low temperature co-fired ceramic (LTCC), or ceramic. Chips such as a processor (not shown) except the detector (e.g., a millimeter wave zero bias GaAs schottky diode) (see reference numeral 860 of FIG. 10) may be 2-dimensionally mounted on the interposer 908. An electrical signal or date may be transmitted between wafers or chips using a wireless TSV between the antenna and the interposer 908 or within the interposer 908.

Figure 17:
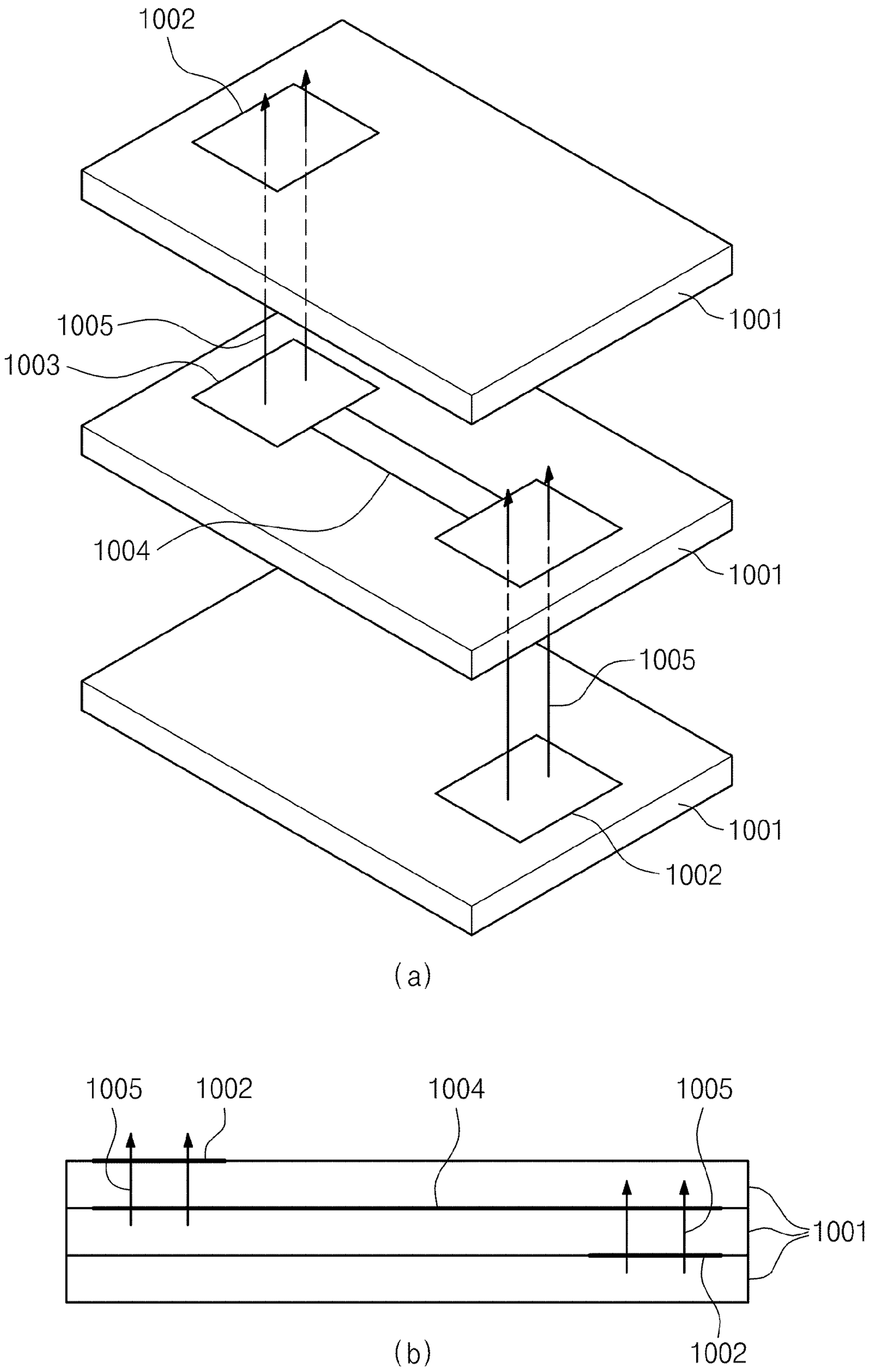
FIG. 17 is a view illustrating an example of an inductance coupling of an interposer of FIG. 16.

FIG. 17 is a view illustrating an example of an inductance coupling of an interposer of FIG. 16. FIG. 17A 3-dimensionally illustrates the inductance coupling, and FIG. 17B illustrates a sectional view of the inductance coupling.

Referring to FIGS. 17A and 17B, inductors 1002 are disposed on three wafers 1001. An inductance coupling due to a magnetic field may be formed between the inductor 1002 and the inductor 1003. The two wafers may be connected to each other through a wireless TSV due to the inductance coupling. A stacked redistribution layer (RDL) may include a dielectric made of a polymer or oxide layer and metal interconnections. A via may be defined within the dielectric to vertically connect the metal interconnections to each other. The interposer 1004 may be used as a medium for manufacturing a system or sub-system having a high density on silicon to mount the system or sub-system on the PCB.

Figure 18:
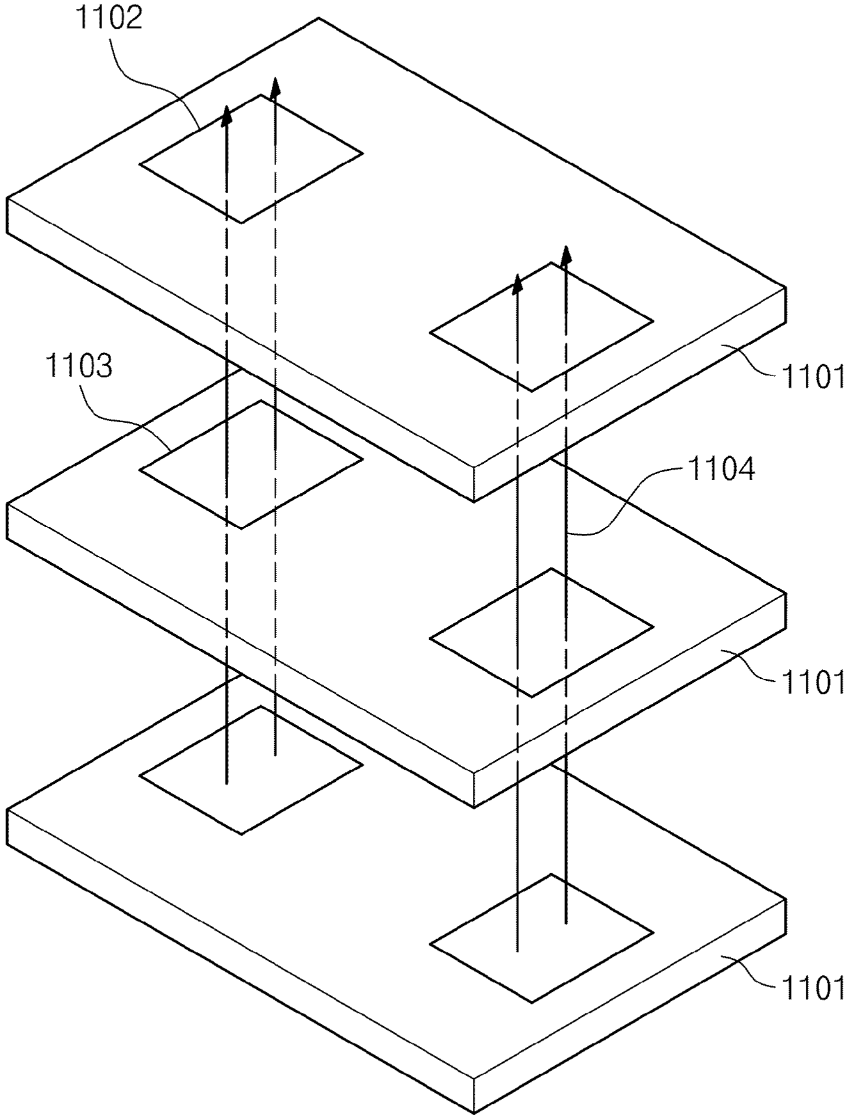
FIG. 18 is a view illustrating another example of an inductance coupling of an interposer of FIG. 16.
Figure 18:
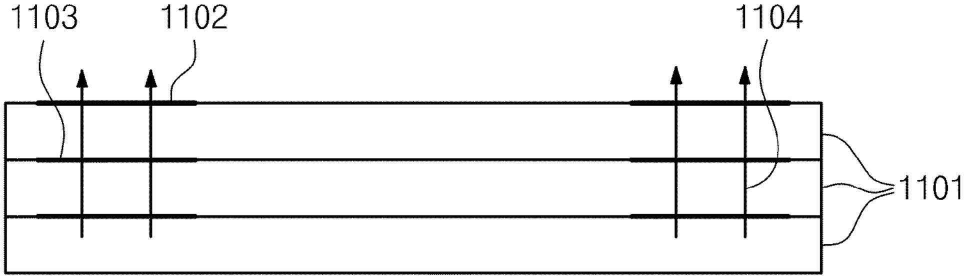

FIG. 18 is a view illustrating another example of the inductance coupling of the interposer 908 of FIG. 16. Referring to FIGS. 18A and 18B, an inductor 1102 and an inductor 1103 are connected through a wireless TSV due to an inductance coupling 1104 by a magnetic field on a silicon wafer 1101. RDL may include a dielectric made of a polymer or oxide layer and metal interconnections. A via may be defined within the dielectric to vertically connect the metal interconnections to each other. The wireless TSV may be used as a medium for manufacturing a system or sub-system having a high density on silicon to mount the system or sub-system on the PCB.

Since the sensing device according to this embodiment of the present invention uses the wireless TSV using the inductance coupling instead of a TSV, a 3D stacked layer may be realized through a simple process.

Figure 19:
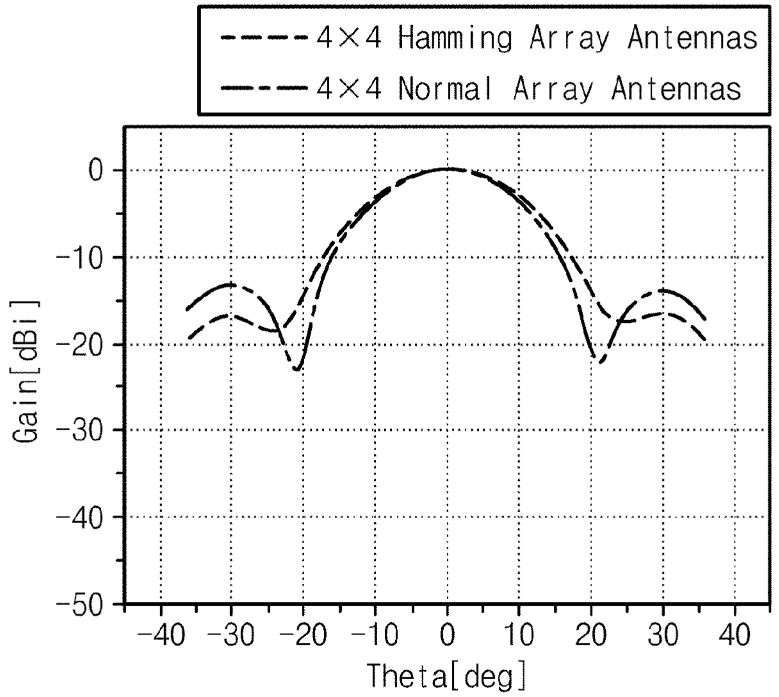
FIGS. 19 and 20 are graphs illustrating a beam pattern (see FIG. 19) and a return loss (see FIG. 20) of an antenna array of a sensing device according to an embodiment of the present invention.
Figure 20:
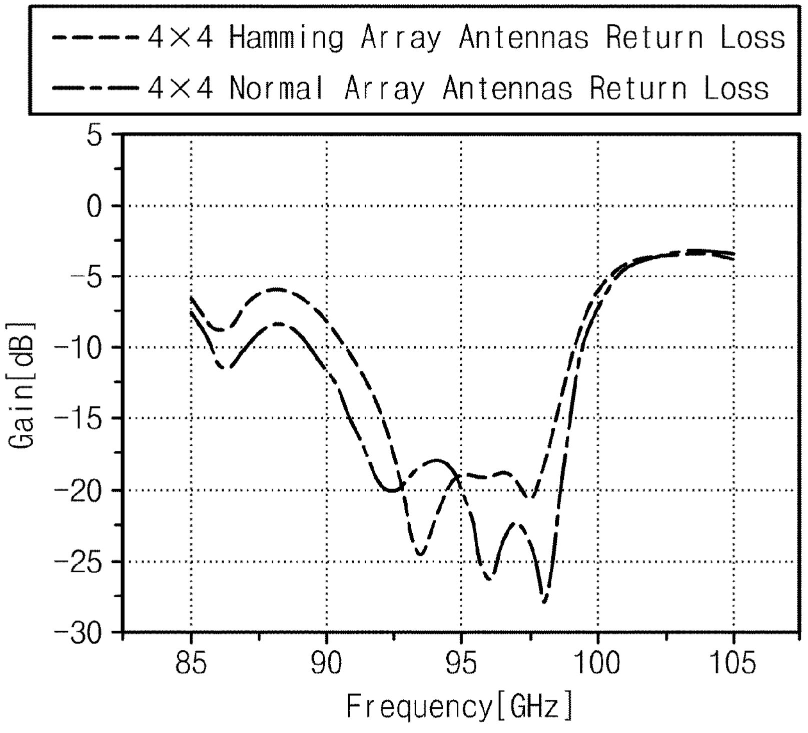

FIGS. 19 and 20 are graphs illustrating a beam pattern (see FIG. 19) and a return loss (see FIG. 20) of an antenna array of a sensing device according to an embodiment of the present invention. FIGS. 19 and 20 illustrate a difference between a normal antenna array having a 4×4 antenna array and a hamming antenna array.

Referring to FIG. 19, in a normal antenna array, a main lobe and a side lobe have a gain difference of about 13 dBi to about 15 dBi therebetween. On the other hand, in a hamming antenna array, a main lobe and a side lobe have a gain difference of about 18 dBi to about 19 dBi therebetween. Referring to FIG. 20, it is seen that a return loss between the normal antenna array and the hamming antenna array is very subtle.

FIGS. 21 to 26 are graphs illustrating a beam pattern and a maximum intensity of an antenna array of a sensing device according to an embodiment of the present invention.

Figure 21:
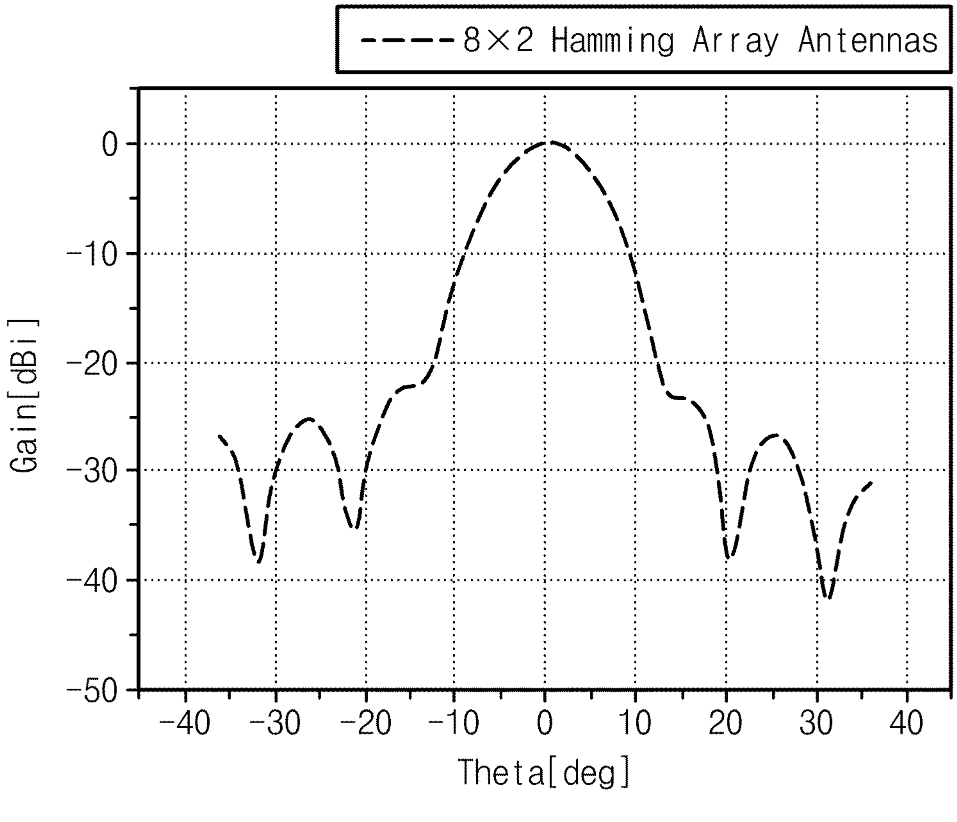
FIGS. 21 to 26 are graphs illustrating a beam pattern and a maximum intensity of an antenna array of a sensing device according to an embodiment of the present invention.
Figure 22:
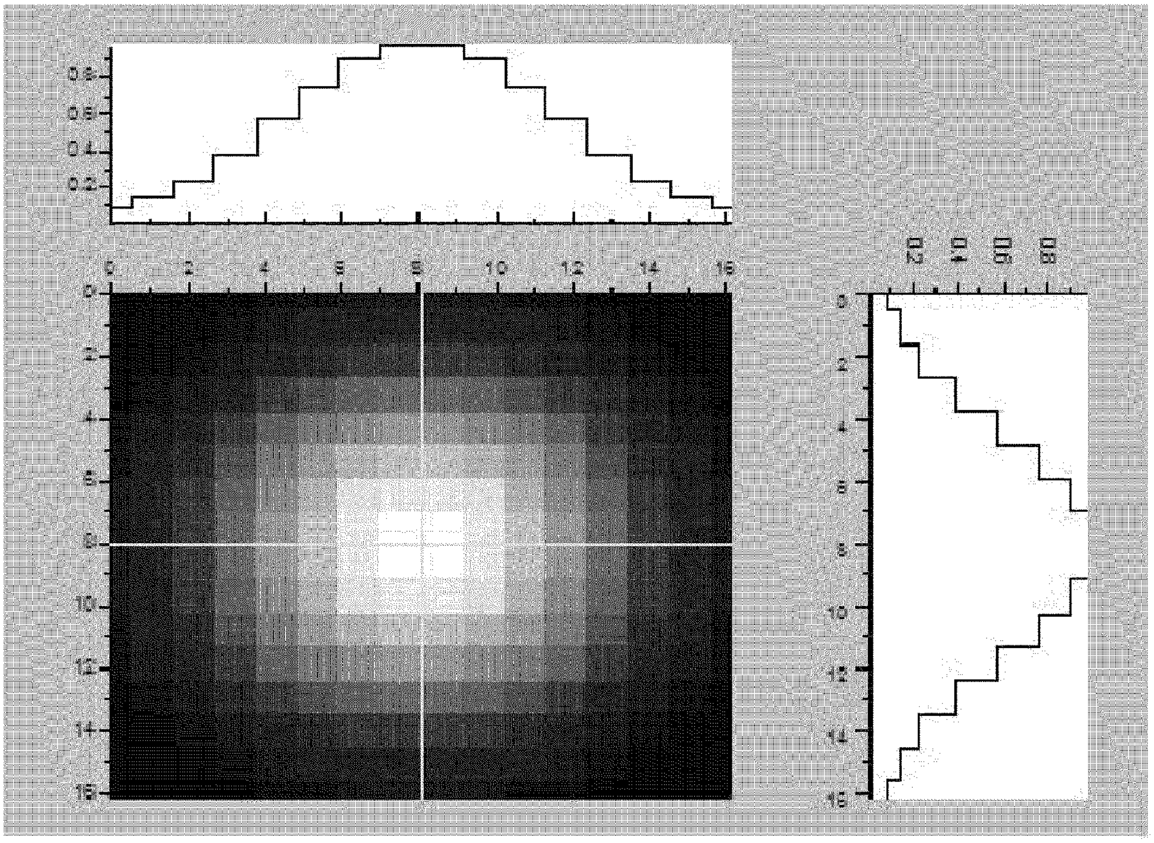
Figure 23:
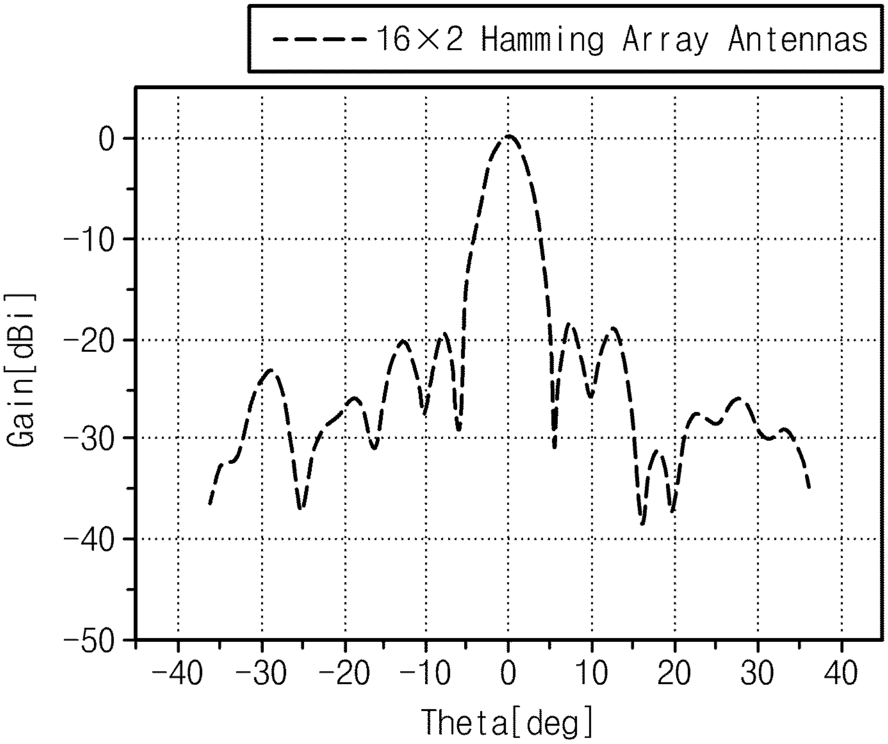
Figure 24:
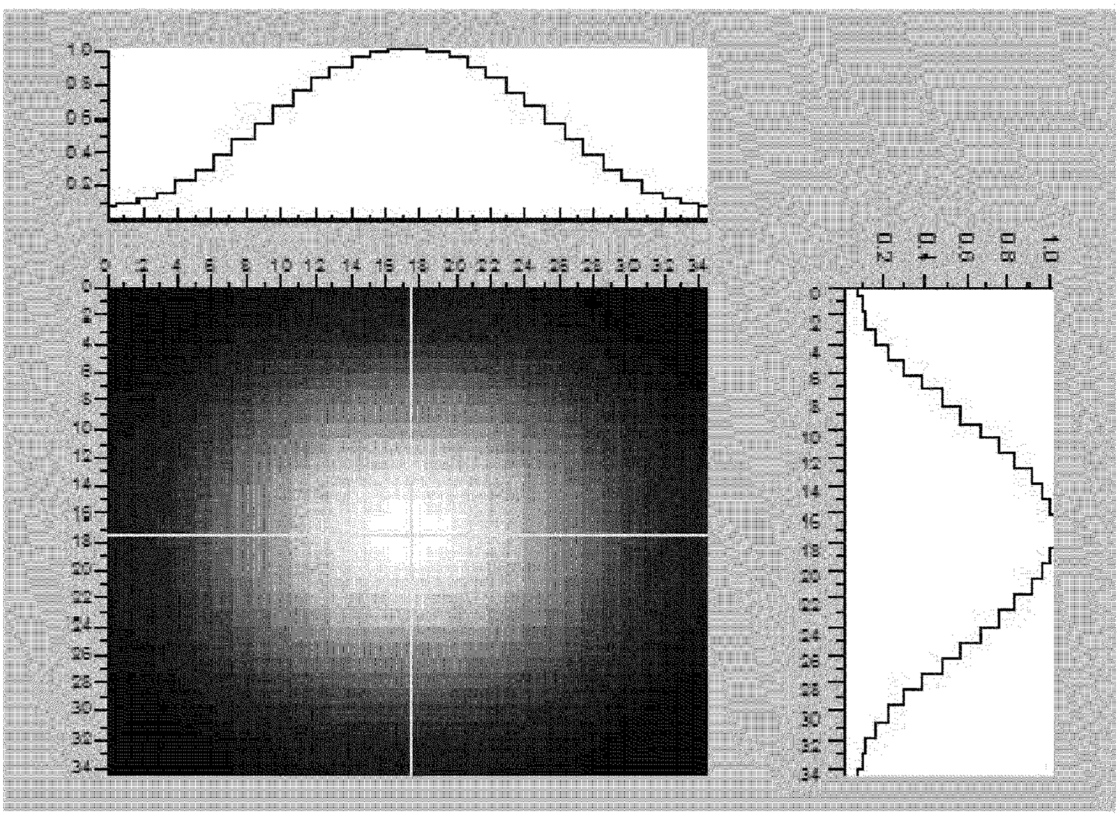
Figure 25:
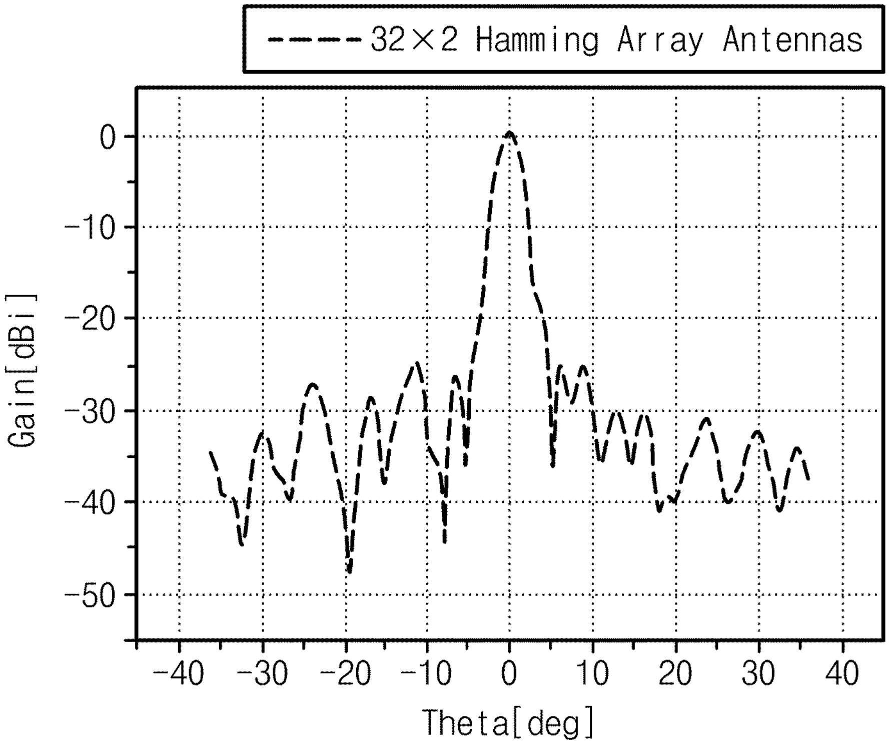
Figure 26:
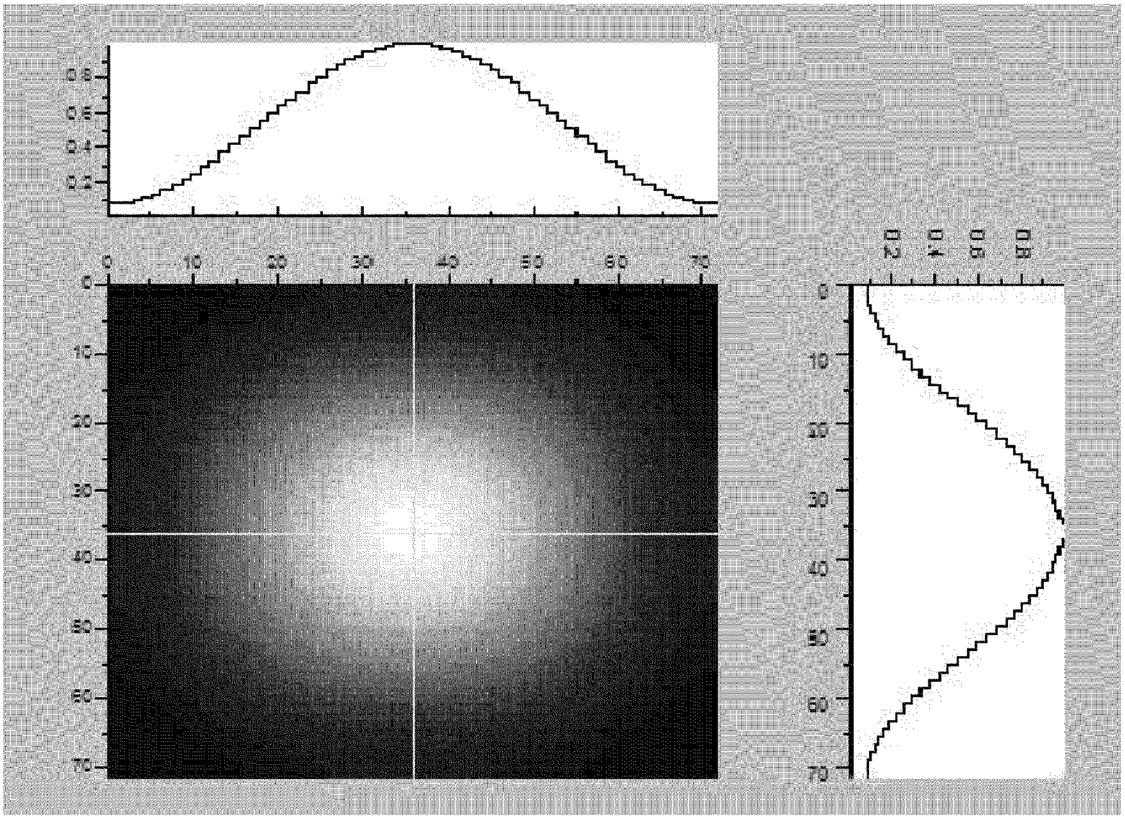

Referring to FIG. 21, in an 8×2 hamming antenna array, a main lobe and a side lobe have a gain difference of about 25 dBi or more therebetween. Referring to FIG. 22, it is seen that maximum intensity of an 8×8 hamming antenna array is 64 pixels per frame. Referring to FIG. 23, in a 16×2 hamming antenna array, a main lobe and a side lobe have a gain difference of about 20 dBi or more therebetween. Referring to FIG. 24, it is seen that maximum intensity of a 16×16 hamming antenna array is 254 pixels per frame. Referring to FIG. 25, in a 32×2 hamming antenna array, a main lobe and a side lobe have a gain difference of about 25 dBi or more therebetween. Referring to FIG. 26, it is seen that maximum intensity of a 32×32 hamming antenna array is 1,024 pixels per frame.

The sensing device according to the embodiments of the present invention uses the multi beam antenna array. The multi beam antenna array has an appeal to communication systems and image systems at both narrowband and broad band. When compared to an electronically scanned antenna array, the multi beam communication system is further adapted for a plurality of users. In the image system, the multi beam system may obtain overall spatial resolution in real-time environments. Furthermore, the multi beam system may further precisely provide image date in scattering environments.

The sensing device according to the embodiments of the present invention may lend a user a helping hand when a manless flying object or helicopter avoids obstacles under fog or cloudy climate condition. Also, the sensing device may be used for searching a position of a fire point in smoke and concealed objects. In addition, the sensing device may be used for missile guidance systems.

Also, the sensing device according to the embodiments of the present invention may have properties such as light-weight, low cost, small size, simplicity, low power consumption, rugged, and video rate having a low frequency. Thus, the sensing device according to the embodiments of the present invention may be applicable for an image sensing microantenna system and obtain a large amount of image date for only a brief time.

The sensing device according to the present invention may detect images using the inexpensive zero bias schottky diode or tunnel diode and may be realized using a silicon CMOS process at a low cost. Also, the present invention may use the 3D stacked layer process to realize the small size, lightweight, and simplicity.

As a system clock speed increases in recent years, the delay, noise, and power consumption due to the interconnection between the devices becomes an obstacle to the system performance improvement. Thus, the minimized interconnection is required.

In the sensing device and the method of manufacturing the same according to the present invention, since the interconnection may become shorter using the 3D stacked layer, the delay, noise, and power consumption may be reduced. Also, the sensing device may have a high bandwidth.

The 3D stacked layer technology of a silicon chip using the TSV is getting the spotlight in aspects of the improvement of integration, the minimization of the interconnection length, and the increase of the degree of freedom in routing. However, a conventional 3D stacked layer technology is difficult to diffuse its technology because it requires a higher fabrication cost. In particular, a TSV hole filling technology and a chip bonding technology cause a considerable cost increase and low reliability. However, according to the manufacturing method of the present invention, since the inductance coupling is used, the manufacturing cost may be reduced and the reliability may be improved.

As described above, in the sensing device having the multi beam antenna array according to the embodiment of the present invention, the antenna design and its manufacturing process can be simplified, and also, the manufacturing cost can be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A sensing device having a multi beam antenna array, comprising:
- a top wafer;
- an antenna including the top wafer and a bottom wafer bond-coupled to the top wafer, wherein the antenna has an air cavity between the top wafer and the bottom wafer;
- a substrate; and
- an interposer disposed between the antenna and the substrate.

2. The sensing device of claim 1, wherein a slot pattern is disposed on a bond coupling part of the bottom wafer.

3. The sensing device of claim 2, wherein a patch is disposed on the top wafer, and a feed line is disposed on the bottom wafer.

4. The sensing device of claim 1, wherein the substrate is formed of silicon, GaAs, low temperature co-fired ceramic, or ceramic.

5. The sensing device of claim 1, wherein the substrate and the interposer are connected to each other through a solder ball.

6. The sensing device of claim 1, wherein the interposer and the antenna are connected to each other through a through silicon via (TSV).

7. The sensing device of claim 1, wherein a diode detecting a signal inputted through the antenna is integrated with the interposer.

8. The sensing device of claim 7, wherein the diode comprises a millimeter wave zero bias GaAs schottky diode.

9. The sensing device of claim 7, wherein the diode comprises a tunnel diode.

10. The sensing device of claim 1, wherein the antenna and the interposer transmit a signal therebetween using an inductance coupling.

* * * * *